(12) United States Patent
Davis et al.

(10) Patent No.: US 9,391,062 B2
(45) Date of Patent: Jul. 12, 2016

(54) APPARATUSES, CIRCUITS, AND METHODS FOR PROTECTION CIRCUITS FOR DUAL-DIRECTION NODES

(75) Inventors: James E. Davis, Boise, ID (US); Michael D. Chaine, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1258 days.

(21) Appl. No.: 13/302,943

(22) Filed: Nov. 22, 2011

(65) Prior Publication Data
US 2013/0128399 A1 May 23, 2013

(51) Int. Cl.
*H02H 3/22* (2006.01)
*H01L 27/02* (2006.01)
*H01L 29/74* (2006.01)
*H01L 29/87* (2006.01)

(52) U.S. Cl.
CPC ......... *H01L 27/0262* (2013.01); *H01L 27/0255* (2013.01); *H01L 29/7436* (2013.01); *H01L 29/87* (2013.01)

(58) Field of Classification Search
USPC .......................... 361/56, 111, 9; 257/355–360
See application file for complete search history.

(56) References Cited

U.S. PATENT DOCUMENTS

| 5,182,220 | A | 1/1993 | Ker et al. |
| 6,765,771 | B2 | 7/2004 | Ker et al. |
| 6,933,540 | B2 | 8/2005 | Liu et al. |
| 7,342,282 | B2 | 3/2008 | O et al. |
| 2003/0076636 | A1 | 4/2003 | Ker et al. |
| 2005/0275029 | A1 | 12/2005 | Watt |
| 2007/0058307 | A1* | 3/2007 | Mergens ............ H01L 29/7436 361/56 |
| 2008/0029782 | A1* | 2/2008 | Carpenter ........... H01L 27/0255 257/173 |
| 2013/0050887 | A1* | 2/2013 | Fan ..................... H01L 27/0617 361/57 |

OTHER PUBLICATIONS

Liu, Z. et al., "An Improved Bidirectional SCR Structure for Low-Triggering ESD Protection Applications", Electron Device Letters, IEEE, vol. 29, Issue 4, Apr. 2008, pp. 360-362.
Salcedo, J. et al., "A Novel Dual-Polarity Device with Symmetrical/Asymmetrical S-type I-V Charateristics for ESD Protection Design", Electron Device Letters, IEEE, vol. 27, Issue 1, Jan. 2006, pp. 65-67.
Vashchenko, V. et al., "Implementation of Dual-Direction SCR Devices in Analog CMOS Process", 29th Electrical Overstress/Electrostatic Discharge Symposium, Sep. 2007, pp. 1B.5-1-1B.5-5.
Wang, A. et al., "A Low-Ttriggering Circuitry for Dual-Direction EDS Protection", Proceedings of the IEEE, Custom integrated Circuites, May 1999, pp. 139-142.
Wang, A. et al., "On a Dual-Polarity On-Chip Electrostatic Discharge Protection Structure", IEEE Transactions on Electron Devices, vol. 48, Issue 5, May 2001, pp. 978-984.

* cited by examiner

*Primary Examiner* — Danny Nguyen
(74) *Attorney, Agent, or Firm* — Dorsey & Whitney LLP

(57) ABSTRACT

Apparatuses, circuits, and methods are disclosed for biased protection circuits for dual-direction nodes. In one such example apparatus, a protection circuit is coupled to a dual-direction node, and includes a positive protection component and a negative protection component. The protection circuit is configured to protect the dual-direction node during an over-limit electrical condition. The protection circuit is configured to control a turn-on condition of the protection circuit.

31 Claims, 6 Drawing Sheets

APPARATUSES, CIRCUITS, AND METHODS FOR PROTECTION CIRCUITS FOR DUAL-DIRECTION NODES

TECHNICAL FIELD

Embodiments of the invention relate generally to integrated circuits, and more particularly, in one or more of the illustrated embodiments, to protection circuits for dual-direction nodes.

BACKGROUND OF THE INVENTION

Connection nodes in integrated circuits may include one or more bond pads, pins, die terminals, die pads, contact pads, metal junctions, interconnect elements, and so forth. Connection nodes may be used to pass an electrical signal, such as a reference voltage, to one or more circuits. The electrical signal may be used during the normal operation of the one or more circuits. A few examples of connection nodes include nodes that may be used to bypass pump circuitry, nodes that may be used to bias a portion of a circuit, nodes that may be used to pass an input or output signal, and so forth. Some connection nodes are dual-direction in that they are used to pass negative and non-negative electrical signals, such as signals from −6V up to +6V. Among other things, dual-direction connection nodes may allow a broader voltage spectrum to be used in programming an array, such as a memory array, as compared with a single direction node with the same maximum non-negative or maximum negative voltage. Connection nodes may be used in any of a number of apparatuses. As used herein, an apparatus may refer to a number of different things, such as circuitry, a memory device, a memory system (e.g., SSD) or an electronic device or system (e.g., a computer, smart phone, server, etc.).

Connection nodes in integrated circuits, including dual-direction nodes, are sometimes subjected to over-limit electrical conditions such as electrostatic discharge (ESD). One or more protection circuits are often coupled to such dual-direction nodes in order to protect the dual-direction node and circuitry that is coupled to the dual-direction node. Circuitry coupled to a dual-direction node may include active devices such as diodes and bipolar junction transistors (BJTs). This circuitry may need to be protected from, for example, voltages and/or currents associated with ESD events and other over-limit electrical conditions.

Some protection circuits include circuitry that provides a low-impedance conductive path from a node such as a dual-direction node to a reference voltage such as ground and/or to a voltage source such as VCC. The conductive path provides a path to dissipate (e.g., shunt) the current associated with, for example, an ESD event, before the circuitry coupled to the dual-direction node is damaged. Other protection circuits include circuitry that clamps a voltage provided to a dual-direction node.

In designing an adequate protection circuit for a dual-direction node, a turn-on condition such as a turn-on voltage should be sufficiently low to provide protection before other circuitry coupled to the dual-direction node is damaged. Also, the protection circuit should be able to dissipate a sufficient amount of current associated with, for example, an ESD event, as well as be able to clamp a voltage provided to a dual-direction node. A dual-direction node's protection circuit, however, should generally not interfere with the normal operation of other circuitry coupled to the dual-direction node and should not latch up during normal operations. Furthermore, the added capacitance from a protection circuit seen at a dual-direction node may need to be small in high-speed circuits in order to reduce switching delays. Lastly, a protection circuit may need to have a relatively small footprint and have adjustable operating characteristics in some cases.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
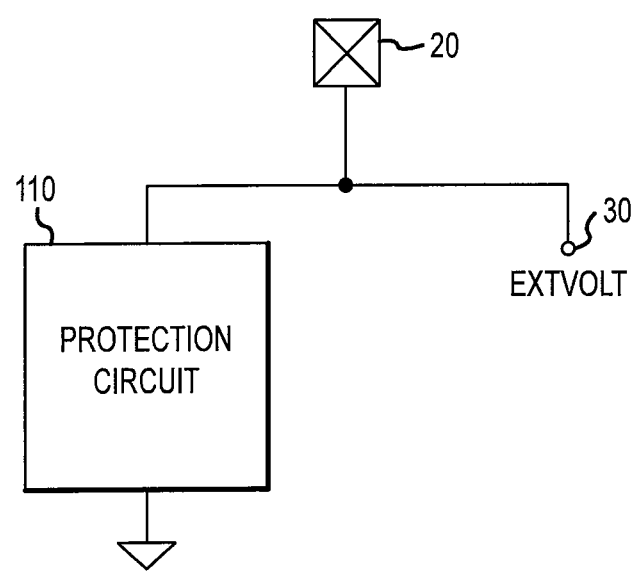
FIG. 1 is a block diagram of a dual-direction node with a protection circuit according to an embodiment of the present invention.

FIG. 1 illustrates a dual-direction node 20 with a protection circuit 110 according to an embodiment of the invention. The dual-direction node 20 may have negative and non-negative electrical signals provided to it. The dual-direction node 20 may be, for example, a bias pin to which negative and non-negative voltages may be provided for use in the normal operation of an integrated circuit that incorporates the dual-direction node. The voltages provided to the dual-direction node 20 may be provided to the integrated circuit through an EXTVOLT connection 30.

As illustrated in FIG. 1, the protection circuit 110 is coupled to the dual-direction node 20 and to a reference voltage node, such as a node that is normally coupled to ground. In other embodiments, the protection circuit 110 may be coupled to, for example, a voltage source node (not shown) in place of or in addition to the reference voltage node. The protection circuit 110 may be configured to protect against over-limit electrical conditions, such as ESD events. For example, the protection circuit 110 may dissipate current and/or clamp the voltage provided to the EXTVOLT connection 30 during an over-limit electrical condition.

Also, one or more active devices (not shown) may be coupled to the EXTVOLT connection 30. The active devices may include, for example, one or more diodes, one or more bipolar junction transistors (BJTs), or other devices, including other devices with a diffusion region. During an over-limit electrical condition, the protection circuit 110 illustrated in FIG. 1 may turn on and dissipate a current and/or clamp the voltage provided to the EXTVOLT connection 30 in order to prevent damage to the one or more active devices coupled to the EXTVOLT connection.

In some embodiments, the protection circuit 110 may include a positive protection component (not shown) configured to turn on the protection circuit in response to, for example, a positive voltage over-limit electrical condition, and provide a low-impedance conductive path from the dual-direction node 20 to a reference voltage node such as ground. The protection circuit 110 may also include a negative protection component (not shown) configured to turn on the protection circuit in response to, for example, a negative voltage over-limit electrical condition, and provide a low impedance conductive path from a reference voltage node such as ground to the dual-direction node 20. As explained in more detail below, the positive protection component and the negative protection component in some embodiments may comprise one or more silicon controlled rectifiers (SCRs), although the positive and negative protection components in other embodiments may comprise other circuit elements in addition to or in place of the one or more SCRs.

Furthermore, as also explained in more detail below, the positive and negative protection components may be merged together in some embodiments, although in other embodiments they may be separate and distinct. Also, in some embodiments, the protection circuit 110 may include multiple positive and/or negative protection components. In some embodiments, control signal(s) may be provided to any, some, or all of the positive protection component(s) and/or negative protection component(s) to control, for example, one or more turn-on condition(s), such as turn-on voltage(s), of the protection circuit.

An integrated circuit that incorporates the protection circuit 110 may have several operating modes, such as a powered-off mode and a powered-on mode. The integrated circuit may also have other operating modes, such as a standby mode or a sleep mode. The behavior of the protection circuit 110 may vary depending on the operating mode of the integrated circuit. For example, it may be desirable for a protection circuit in an integrated circuit operating in a powered-off mode to turn on at low voltages (e.g. greater than +/−2V) in order to, for example, protect the dual-direction node 20 from an over-limit electrical condition by dissipating any current associated with the over-limit electrical condition and/or clamp the voltage provided to the EXTVOLT connection 30. As another example, it may be desirable for a protection circuit in an integrated circuit in a powered-on mode to only turn on at higher voltages. For example, if the dual-direction node 20 normally receives voltages of +/−5V during a powered-on mode, it may be desirable for the protection circuit 110 to only turn on if the voltage provided to the dual-direction node is greater than +/−5V. In other instances, it may be desirable for the protection circuit 110 to turn on only if the voltage provided to the dual-direction node is greater than +/−6V, or other voltages such as +6V/−4V. It may also be desirable to adjust the protection circuit so that it turns on at different voltage levels for other operating modes, or even so that it turns on at different voltage levels in a single operating mode. In other instances, it may be desirable for the protection circuit 110 to turn on at certain current levels. Generally, for each operating mode of an integrated circuit, the protection circuit 110 may have one or more positive turn-on voltages and/or one or more negative turn-on voltages, as explained in more detail below. In other embodiments, however, the protection circuit 110 may have other turn-on conditions, such as a turn-on current and so forth.

The protection circuit 110 may change its operating behavior, in some embodiments, in response to one or more control signals, and/or in response to whether such control signals are provided or not provided to the protection circuit. The control signals may be bias signals having a voltage level. Whether the control signals are provided to the protection circuit 110 and if so, what their voltage levels are, may correspond in some embodiments to the operating mode of an integrated circuit incorporating the protection circuit 110. For example, in a powered-off mode, the one or more control signals may not be provided to the protection circuit, whereas in a powered-on mode, the one or more control signals may be provided to the protection circuit at one or more voltage levels. The one or more control signals may also be selectively provided to the protection circuit 110 in other operating modes, such as standby and sleep modes.

During a normal powered-on mode of an integrated circuit that incorporates the protection circuit 110 (e.g., when the dual-direction node 20 is not subject to an over-limit electrical condition), the protection circuit may be inactive (e.g., turned off) and not interfere with the signals provided to the dual-direction node 20 and consequently the EXTVOLT connection 30. Should an over-limit electrical condition (such as a large positive voltage), however, be provided to the dual direction node 20 during a powered-on mode, the protection circuit 110 may turn on and dissipate any current associated with the over-limit electrical condition and/or clamp the voltage provided to the EXTVOLT connection 30. For example, the protection circuit 110 may turn on if the voltage provided to the dual-direction node 20 is greater than the one or more turn-on voltages of the protection circuit 110, or if other turn-on conditions are satisfied.

During a powered-off mode of the integrated circuit incorporating the protection circuit 110, the protection circuit may similarly turn on when an over-limit electrical condition occurs, although the powered-off mode turn-on voltage(s) (or other turn-on condition) of the protection circuit 110 may be smaller in magnitude than the respective powered-on mode turn-on voltage(s) (or other turn-on condition). The protection circuit 110 may turn on at similar or different voltages (or other conditions) in other operating modes. When the protection circuit 110 turns on in response to, for example, an over-limit electrical condition, it may provide a low-impedance conductive path from the dual-direction node 20 to a reference voltage such as ground, or vice versa, in order to dissipate the current associated with the over-limit electrical condition and/or clamp the voltage provided to the EXTVOLT connection 30.

Figure 2:
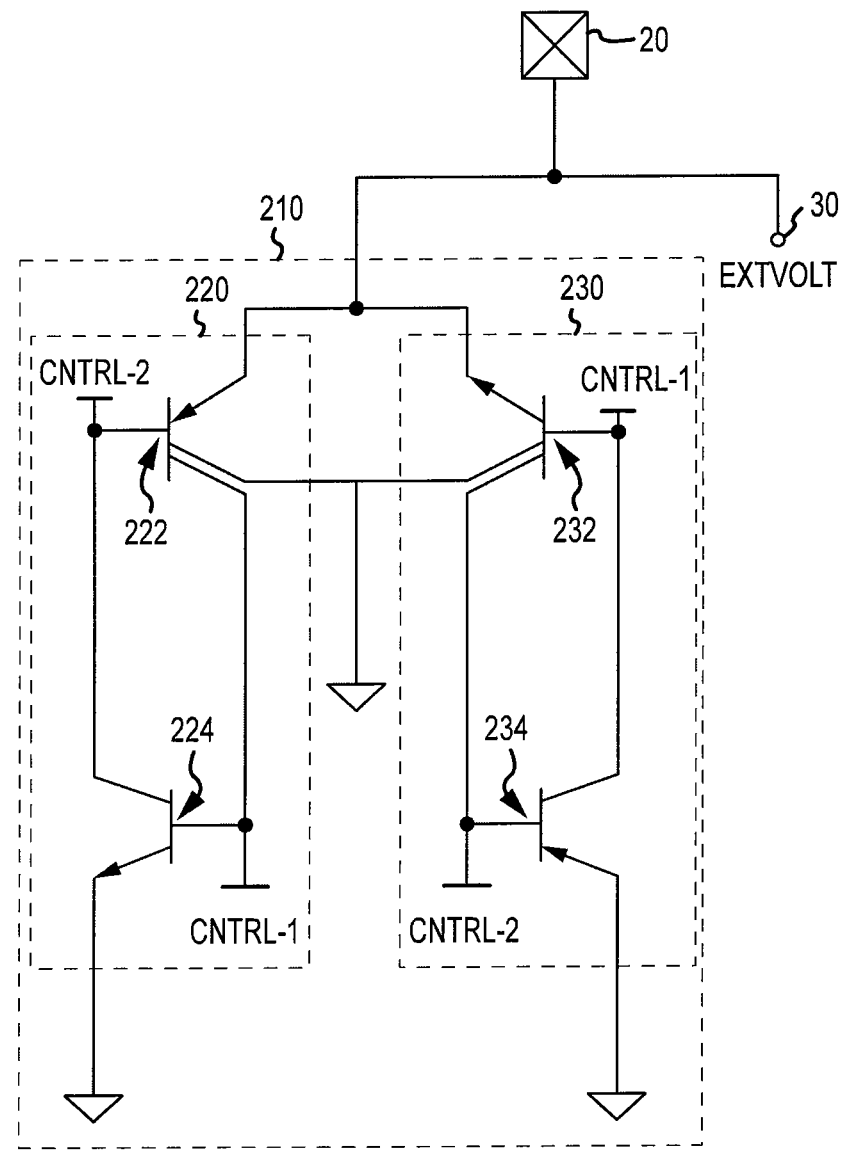
FIG. 2 is a schematic diagram of a dual-direction node with a protection circuit according to an embodiment of the invention.

FIG. 2 illustrates a protection circuit 210 coupled to a dual-direction node 20 according to an embodiment of the invention. The protection circuit 210 may include a first component 220, which may be an SCR, and a second component 230, which may also be an SCR. The first component 220 may be configured as a positive protection component and may turn on in response to a turn-on condition, such as a positive turn-on voltage. As mentioned above, in some embodiments, the first component 220 may be configured to turn on in response to other turn-on conditions, such as a turn-on current, in addition to or in place of a turn-on voltage. Thus although the first component 220 (and later the second component 230) may be described with reference to turn-on voltages, it is to be understood that the first and second components may turn on in response to other turn-on conditions, such as a turn-on current, and are not limited to turning on only in response to one or more turn-on voltages. Returning to FIG. 2, the first component may be configured to turn on in response to a positive voltage being provided to the dual-direction node 20, with the voltage provided to the dual-direction node 20 being greater than a positive turn-on voltage, such as during a positive over-limit electrical condition. The first component 220 may remain off if the voltage provided to the dual-direction node is less than the positive turn-on voltage. In the embodiment illustrated in FIG. 2, the first component 220 may be represented as a PNP-BJT 222 coupled to the dual-direction node 20, and a NPN-BJT 224 coupled between the PNP-BJT 222 and a reference voltage node, such as ground. Alternatively, the first component 220 may be visualized as three back-to-back diodes (not shown). A first control signal, CNTRL-1, may be provided to the base of the NPN-BJT 224, and a second control signal, CNTRL-2, may be provided to the base of the PNP-BJT 222. The CNTRL-1 and CNTRL-2 signals may be bias signals in some embodiments of the invention.

The second component 230 may be configured as a negative protection component and may turn on in response to a negative voltage being provided to the dual-direction node 20, with the voltage provided to the dual-direction node 20 being greater than a negative turn-on voltage, such as during a negative over-limit electrical condition. The first component 220 may remain off if the voltage provided to the dual-direction node is less than the negative turn-on voltage. In the embodiment illustrated in FIG. 2 the second component 230 may be represented as a NPN-BJT 232 coupled to the dual-direction node 20, and a PNP-BJT 234 coupled between the NPN-BJT 232 and a reference voltage, such as ground. The second component 230 may also be visualized as back-to-back diodes (not shown).

In some embodiments, the first and second components 220, 230 may be configured to not snapback, but rather to act as diodes having a simpler switching behavior as compared with SCRs (or other components) that snapback. The first and second components 220, 230, may be configured in this manner due to, for example, the underlying physical layout of the components and the doping profiles of the physical layout, as well as the voltages that selectively bias portions of the components. It may be advantageous in some embodiments for the components 220, 230 to behave similar to diodes (e.g., by not snapping back, but rather quickly conducting current at a specific turn-on voltage) in order to better protect certain circuits, such as active circuits, coupled to the EXTVOLT connection 30. Protection circuits that do not exhibit a snapback characteristic may also in some embodiments be quicker to respond to, for example, an over-limit electrical condition than a corresponding snapback-SCR-type protection circuit. Also, protection circuits that do not snapback may in some embodiments be less likely to latch up, and can instead, turn back off when the voltage provided to the protection circuit decreases below the turn-on voltage, unlike in an SCR that exhibits snapback behavior. In other embodiments, however, such as in protection circuits configured to protect gated devices, snapback characteristics of an SCR may be desirable. One example of a physical layout of an embodiment that does not snapback is shown as a cross-section view in FIG. 3, and is described in more detail below.

Figure 3:
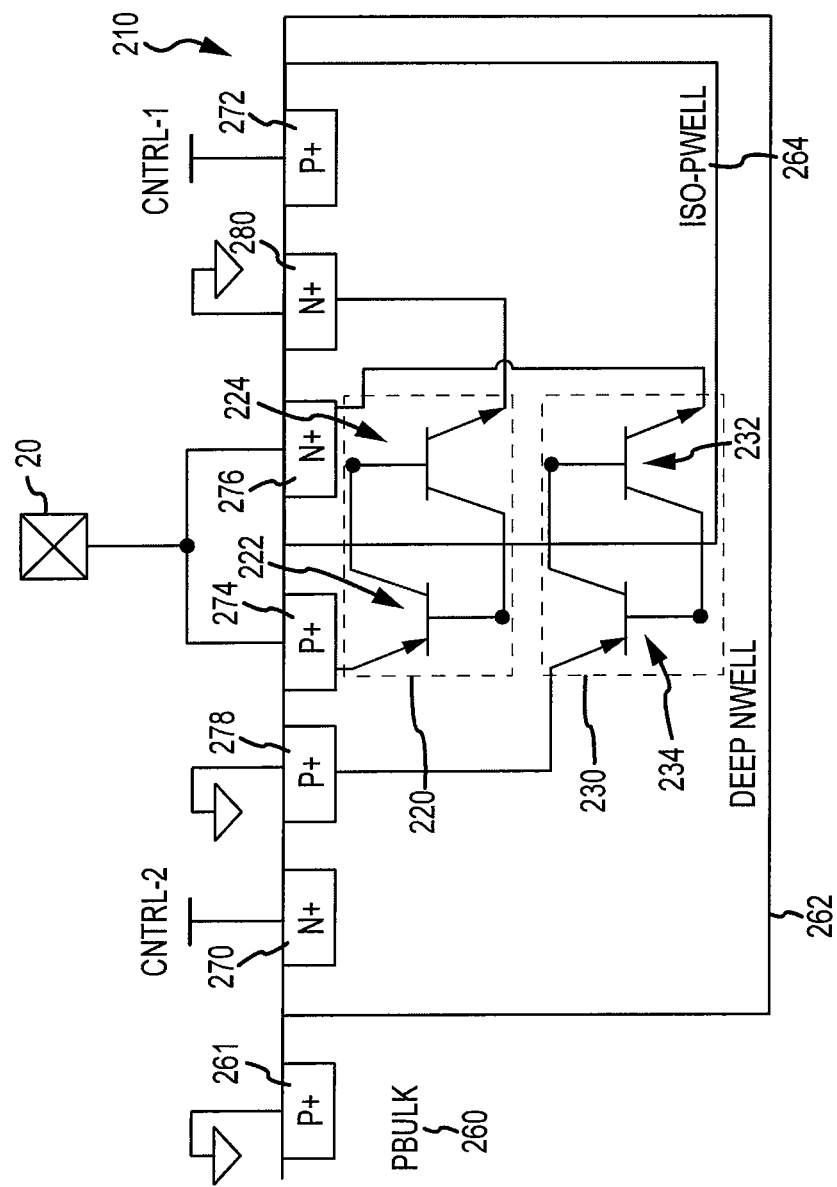
FIG. 3 is a cross-sectional diagram of the dual-direction node with protection circuit of FIG. 2 according to an embodiment of the invention.

In some embodiments, the CNTRL-1 signal may be provided to the base of the NPN-BJT 232 in the second component 230 and the base of the NPN-BJT 224 in the first component 220, and the CNTRL-2 signal may be provided to the base of the PNP-BJT 234 in the second component and the base of the PNP-BJT 222 in the first component. As described in more detail below in connection with FIG. 3, portions of the first component 220 may be merged with portions of the second component 230 in that, for example, the first component and the second component may share a common active well region, for example, a p-well or a common n-well. In embodiments where the first and second components 220, 230 are at least partially merged as illustrated in FIG. 3, the CNTRL-1 signal may be provided to the shared n-well, and/or the CNTRL-2 signal may be provided to the shared p-well. In other embodiments, however, the first and second components 220, 230, may be separate and distinct.

Similar to the protection circuit 110 illustrated in FIG. 1, an integrated circuit that incorporates the protection circuit 210 may have several operating modes, and whether the CNTRL-1 and CNTRL-2 signal are provided to the protection circuit 210 (and if so, what the specific voltages will be) may depend, at least in part, on the operating mode of the integrated circuit. For example, in a powered-on mode, the CNTRL-1 and CNTRL-2 signals may be provided to the bases of the BJTs 224, 232 and 222, 234, respectively, in order to bias the protection circuit 210. In a powered-off mode, the CNTRL-1 and CNTRL-2 signals may not be provided to the protection circuit 210 because, for example, the integrated circuit is turned off and the bias signals are not be generated when the integrated circuit is turned off. In this powered-off mode, the bases of the BJTs 224, 232, 222, 234 may be left floating.

In an example powered-on mode operation, the CNTRL-1 signal may be approximately −6V and may be generated by, for example, pump circuitry. In some embodiments, the CNTRL-1 signal may be a bias signal generated and used to bias one or more isolated p-wells in the integrated circuit (including isolated p-wells outside of the protection circuit 210). The CNTRL-2 signal in the example powered-on operation may be approximately +6V and may be generated by, for example, a reverse diode connection to a voltage source. In this example powered-on mode when voltages between approximately −6V and +6V are provided to the dual-direction node 20, both the first component 220 and the second component 230 may remain turned off. The component 220 may remain turned off because the CNTRL-2 signal biases the base of the PNP-BJT 222 at +6V and thus prevents the emitter-base junction from becoming forward biased for dual-direction node voltages less than +6V. Similarly, the component 230 may remain turned off because the CNTRL-1 signal biases the base of the NPN-BJT 232 at −6V and thus prevents the base-emitter junction from becoming forward biased dual-direction node 20 voltages more positive than −6V.

However, if the voltage provided to the dual-direction node 20 is a positive voltage greater than +6V, for example during an over-limit electrical condition of +15V, the emitter-base junction of the PNP-BJT 222 may become forward biased and begin conducting current, thus turning on the first component 220. During the +15V positive voltage over-limit electrical condition, the second component 230 remains off because the base-emitter junction of the NPN-BJT 232 remains reverse biased. Similarly, if the voltage provided to the dual-direction node 20 is a negative voltage greater than −6V, for example during an over-limit electrical condition of −15V, the base-emitter junction of the NPN-BJT 232 may become forward biased and begin conducting current, thus turning on the second component 230. During the −15V negative voltage over-limit electrical condition, the first component 220 remains off because the emitter-base junction of the PNP-BJT 222 remains reverse biased. The current-voltage characteristics of the protection circuit 210 in a powered-on mode are described in more detail below in connection with FIG. 5. Generally, the positive and negative turn-on voltages for the protection circuit 210 in a powered-on mode may be based at least in part by the CNTLR-1 and CNTLR-2 signals.

In an example powered-off mode operation, the CNTRL-1 and the CNTRL-2 signals may not be provided to the respective bases of the BJTs 222, 224, 232, 234 in the protection circuit 210, which may decrease both the positive and negative turn-on voltages of the protection circuit in order to more quickly turn on the protection circuit when unpowered. In this example powered-off mode, when voltages between approximately −2V and +2V are provided to the dual-direction node 20, both the first component 220 and the second component 230 may remain turned off. The components 220 and 230 may remain turned off because voltages from −2V to +2V may be insufficient to forward bias the emitter-base junction of the PNP-BJT 222 and the base-emitter junction of the NPN-BJT 232, and thus may be insufficient to turn on either the component 220 or the component 230.

However, if the voltage provided to the dual-direction node 20 is a positive voltage greater than +2V, for example during an over-limit electrical condition of +5V, the emitter-base junction of the PNP-BJT 222 may become forward biased and begin conducting current, thus turning on the first component 220. During the +5V positive voltage over-limit electrical condition, the second component 230 remains off because the base-emitter of the NPN-BJT 232 junction remains reverse biased. Similarly, if the voltage provided to the dual-direction node 20 is a negative voltage greater than −2V, for example during an over-limit electrical condition of −5V, the base-emitter junction of the NPN-BJT 232 may become forward biased and begin conducting current, thus turning on the second component 230. During the −5V negative voltage over-limit electrical condition, the first component 220 remains off because the emitter-base junction of the PNP-BJT 222 remains reverse biased. The current-voltage characteristics of the protection circuit 210 in a powered-off mode are described in more detail below in connection with FIG. 4. Generally, the positive and negative turn-on voltages for the protection circuit 210 in a powered-off mode may be based at least in part by process characteristics and the physical layout of the protection circuit.

FIG. 3 illustrates a cross-section view of an embodiment of the protection circuit 210 of FIG. 2 according to an embodiment of the invention. In FIG. 3, the protection circuit 210 is formed on a p-type bulk semiconductor material 260 that is coupled to a reference voltage node, such as ground, through a p+ region 261. An n-well 262 may be formed, and an isolated p-well 264 may be formed within the n-well. A first control signal CNTRL-1 may be provided to the isolated p-well 264 through a p+ region 272 within the isolated p-well. Also, a second control signal CNTRL-2 may be provided to the n-well 262 through an n+ region 270 within the n-well. The dual-direction node 20 may be coupled to the n-well 262 through a p+ region 274 formed within the n-well, and may also be coupled to the isolated p-well 264 through an n+ region 276 formed within the isolated p-well. The n-well 262 may further be coupled to the reference voltage node through a p+ region 278, and the isolated p-well 264 may also be coupled to the reference voltage through an n+ region 280.

The parasitic elements induced by the n-well 262, the isolated p-well 264, and the n+ and p+ regions 274, 276, 278, 280 may form the circuit components of the first and second components 220, 230 illustrated in FIG. 2. Other physical layouts, including other arrangements of n+ and p+ regions within n-wells or p-wells, in addition to or in place of those shown in FIG. 3 may also be used. In the embodiment illustrated in FIG. 3, however, a first component 220 may be formed by the p+ region 274, the n-well 262, the isolated p-well 264, and the n+ region 280. The first component 220 may be represented as a PNP-BJT 222 coupled to a NPN-BJT 224, similar to the first component 220 in FIG. 2. The first component 220 may thus be an SCR in some embodiments. In the embodiment illustrated in FIG. 3, a second component 230 may be formed by the n+ region 276, the isolated p-well 264, the n-well 262, and the p+ region 278. The second component 230 may be represented as a NPN-BJT 232 coupled to a PNP-BJT 234, similar to the second component 230 in FIG. 2. The second component 230 may thus also be an SCR in some embodiments. In the embodiment of FIG. 3, the first component 220 and the second component 230 are thus merged in that they share the n-well 262 and the isolated p-well 264. The operation of the protection circuit 210 as illustrated in FIG. 3 may be similar to the operation of the protection circuit 210 as described above in detail in connection with FIG. 2. Also, in some embodiments, the protection circuit 210 may be made more robust by, for example, folding the device (e.g. by mirroring it) in order to effectively double the width of the device, while still maintaining a single isolated p-well 264.

Figure 4:
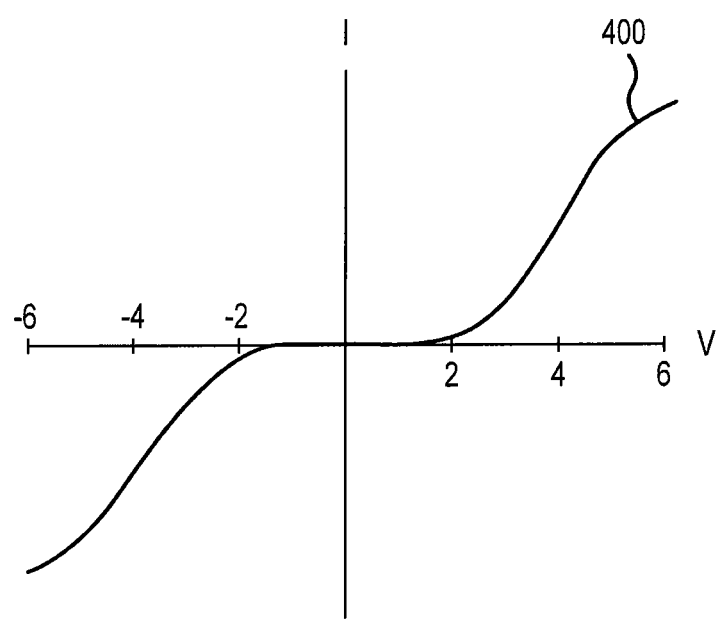
FIG. 4 is a current-voltage diagram for the protection circuit of FIGS. 2 and 3 in a first operating mode according to an embodiment of the invention.

FIG. 4 illustrates a current-voltage curve 400 for the protection circuit of FIGS. 2 and 3 in a first operating mode according to an embodiment of the invention. The first operating mode may be a powered-off mode. As illustrated in FIG. 4, for voltages V between −2V and +2V provided to the dual-direction node 20, there is zero or very little current I through the protection circuit 210. For voltages greater than +2V, the first component 220 may turn on and conduct a positive current form the dual direction node 20 to a reference voltage node, such as ground. For dual-direction node 20 voltages less than −2V, the second component 230 may turn on and conduct a negative current from the dual-direction node 20 to the reference voltage node. In this manner, the protection circuit 210 may turn on at relatively low turn-on voltages (both positive and negative) to help dissipate current associated with an over-limit electrical condition at the dual-direction node 20, and/or clamp the voltage provided to the EXTVOLT connection 30, all during a powered-off mode. In some embodiments, the protection circuit 210 may be configured to dissipate, for example, 45 mA of current in response to an over-limit electrical condition, for example, an ESD event.

Figure 5:
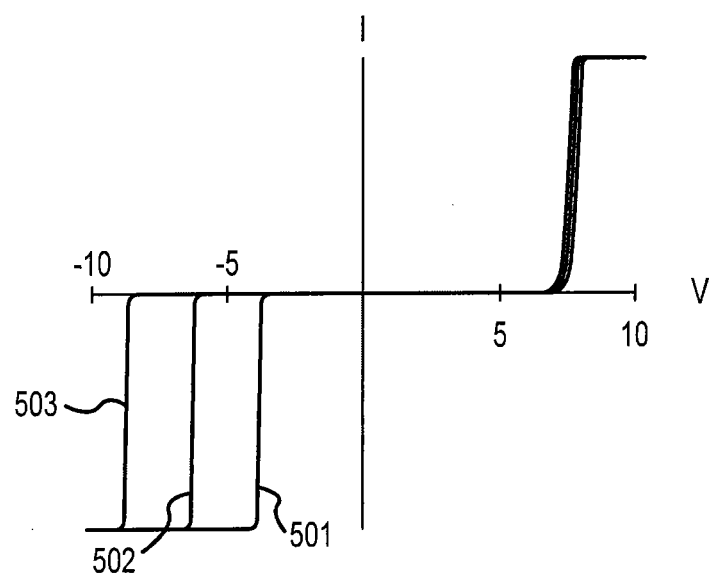
FIG. 5 is a current-voltage diagram for the protection circuit of FIGS. 2 and 3 in a second operating mode according to an embodiment of the invention.

FIG. 5 illustrates three current-voltage curves 501, 502, 503 for the protection circuit of FIGS. 2 and 3 in a second operating mode according to an embodiment of the invention. The second operating mode may be a powered-on mode. The current-voltage curves 501, 502, and 503 may represent a powered-on mode where the CNTRL-1 signal is −4V, −6V, and −8V, respectively, while the CNTRL-2 signal remains a constant voltage, such as approximately +6V. As illustrated by curve 501 in FIG. 5, for voltages V between −4V and +6V provided to the dual-direction node 20, there is zero or very little current I through the protection circuit 210. For voltages greater than +6V, the first component 220 may turn on and conduct a positive current from the dual-direction node to a reference voltage node, such as ground. For voltages more negative than −4V, the second component 230 may turn on and conduct a negative current from the dual-direction node to the reference voltage node. Similarly, for curve 502 in FIG. 5, the components 220, 230 may not turn on so long as the voltage provided to the dual-direction node 20 is between −6V and +6V, and, for curve 503 in FIG. 5, the components 220, 230 may not turn on so long as the voltage provided to the dual-direction node 20 is between −8V and +6V.

Although FIG. 5 illustrates varying the value of the CNTRL-1 signal, the CNTRL-2 signal may also be varied, in which case the positive current curves in FIG. 5 would change accordingly. Generally, the CNTLR-1 and CNTRL-2 signals define, at least in part, the positive and negative turn-on conditions of the first component 220 and the second component 230, respectively. In this manner, the protection circuit 210 may turn on at various positive and negative turn-on voltages to help dissipate current associated with an over-limit electrical condition at the dual-direction node 20, and/or clamp the voltage provided to the EXTVOLT connection 30. One or both of the CNTLR-1 and CNTRL-2 signals may thus be set based on how wide the voltage spectrum needs to be for a particular integrated circuit.

Figure 6:
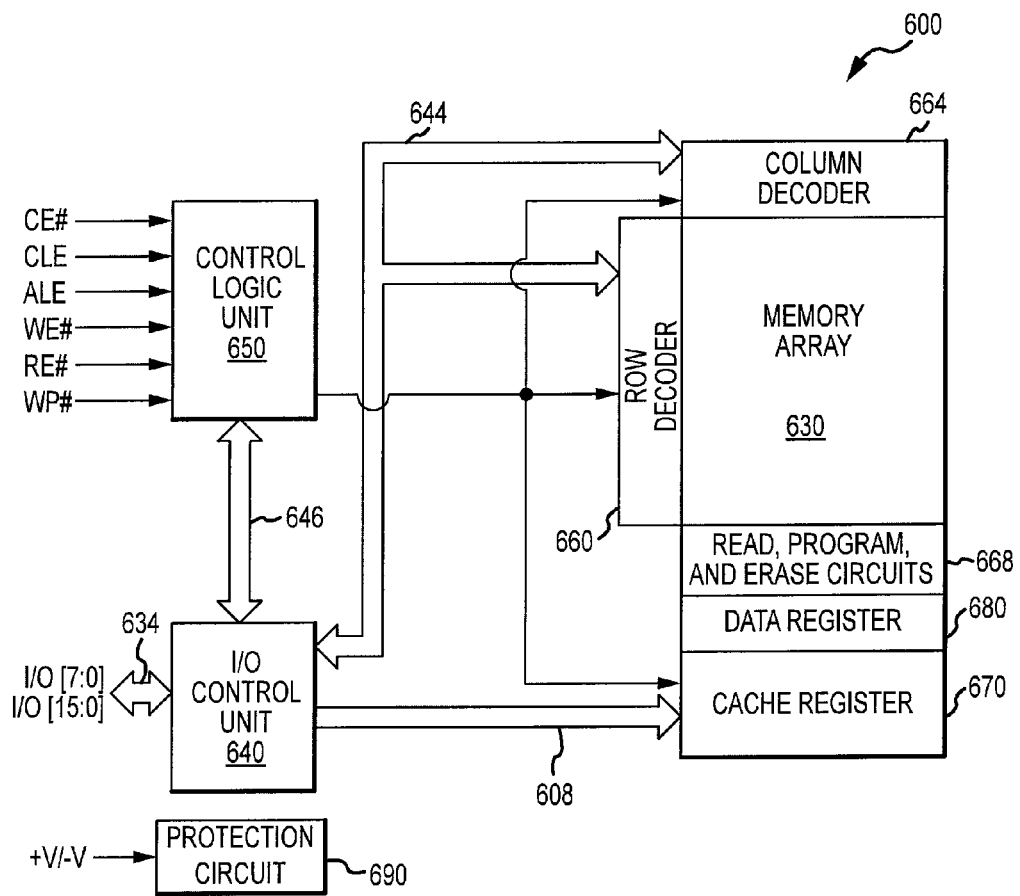
FIG. 6 is a block diagram of a memory having a protection circuit according to an embodiment of the invention.

FIG. 6 illustrates portions of a memory 600 including a protection circuit 690 according to an embodiment of the present invention. The memory 600 includes an array 630 of memory cells. The memory cells may be NAND flash memory cells, but may also be NOR flash, DRAM, SDRAM, or any other type of memory cells. Command signals, address signals and write data signals may be provided to the memory 600 as sets of sequential input/output ("I/O") signals transmitted through an I/O bus 634. Similarly, read data signals may be provided from the flash memory 600 through the I/O bus 634. The I/O bus is connected to an I/O control unit 640 that routes the signals between the I/O bus 634 and an internal data bus 608, an internal address bus 644, and an internal command bus 646. The memory 600 also includes a control logic unit 650 that receives a number of control signals either externally or through the command bus 646 to control the operation of the memory 600.

The address bus 644 provides block-row address signals to a row decoder 660 and column address signals to a column decoder 664. The row decoder 660 and column decoder 664 may be used to select blocks of memory or memory cells for memory operations, for example, read, program, and erase operations. The column decoder 664 enables write data signals to be provided to columns of memory corresponding to the column address signals and allow read data signals to be coupled from columns corresponding to the column address signals.

In response to the memory commands decoded by the control logic unit 650, the memory cells in the array 630 are read, programmed, or erased. Read, program, and erase circuits 668 coupled to the memory array 630 receive control signals from the control logic unit 650 and include voltage sources for generating various voltages for read, program and erase operations.

After the row address signals have been provided to the address bus 644, the I/O control unit 640 routes write data signals to a cache register 670. The write data signals are stored in the cache register 670 in successive sets each having a size corresponding to the width of the I/O bus 634. The cache register 670 sequentially stores the sets of write data signals for an entire row or page of memory cells in the array 630. All of the stored write data signals are then used to program a row or page of memory cells in the array 630 selected by the block-row address coupled through the address bus 644. In a similar manner, during a read operation, data signals from a row or block of memory cells selected by the block-row address coupled through the address bus 644 are stored in a data register 680. Sets of data signals corresponding in size to the width of the I/O bus 634 are then sequentially transferred through the I/O control unit 640 from the data register 680 to the I/O bus 634.

The memory 600 illustrated in FIG. 6 also includes a protection circuit 690. The protection circuit 690 is coupled to a dual-direction node, which is illustrated in FIG. 6 as being provided both non-negative and negative signals V+/V−. The non-negative and negative signals may be further provided to other circuitry of the memory 600, for example, read, program, and erase circuits 668. The protection circuit 690 may include, for example, the protection circuit 110 of FIG. 1, the protection circuit 210 of FIGS. 2 and 3, or another protection circuit in accordance with the present invention. The protection circuit 690 of the memory 600 may in some embodiments be coupled to one or more dual-direction nodes within the memory as illustrated in FIG. 6.

From the foregoing it will be appreciated that, although specific embodiments of the invention have been described herein for purposes of illustration, various modifications may be made without deviating from the spirit and scope of the invention. For example, FIGS. 1, 2, and 3 illustrate embodiments of a protection circuit. However, the protection circuits of the present invention are not limited to having the same design, and may be of different designs and include different circuitry. For example, in some embodiments the protection circuit includes two SCRs (or other components) merged together, whereas in other embodiments, the SCRs are separate and distinct. In still other embodiments, other circuit components and/or parasitic structures may be used. Furthermore, although the embodiments in FIGS. 1, 2, and 3 illustrate a protection circuit coupled to ground, protection circuits may also be coupled to a different reference voltage, or to a voltages source. Accordingly, the invention is not limited except as by the appended claims.

What is claimed is:

1. An apparatus, comprising:
   a protection circuit coupled to a dual-direction node, the protection circuit comprising a positive protection component and a negative protection component, the protection circuit configured to protect the dual-direction node during an over-limit electrical condition,
   wherein the positive protection component includes a first portion formed in a first well and further includes a second portion formed in a second well, and wherein the negative protection component includes a first portion formed in the second well and further includes a second portion formed in the first well,
   wherein the first portion of the positive protection component and the first portion of the negative protection component are coupled to the dual-direction node, and
   wherein the protection circuit is configured to control a turn-on condition of the protection circuit.

2. The apparatus of claim 1, wherein the protection circuit is configured to dissipate current from the dual-direction node during the over-limit electrical condition.

3. The apparatus of claim 2, wherein the positive protection component is configured to dissipate current from a positive ESD event and the negative protection component is configured to dissipate current from a negative ESD event.

4. The apparatus of claim 1, wherein the protection circuit is configured to clamp a voltage provided to the dual-direction node.

5. The apparatus of claim 1, wherein the protection circuit being configured to control a turn-on condition of the protection circuit comprises the protection circuit being configured to have the turn-on condition controlled by a first control signal and a second control signal.

6. The apparatus of claim 5, wherein the positive protection component is controlled by the first control signal and the negative protection component is controlled by the second control signal.

7. The apparatus of claim 6, wherein the positive protection component is controlled by the second control signal and the negative protection component is controlled by the first control signal.

8. An apparatus, comprising:
a protection circuit coupled to a dual-direction node, the protection circuit comprising a positive protection component and a negative protection component, the protection circuit configured to protect the dual-direction node during an over-limit electrical condition,
wherein the protection circuit is configured to have a turn-on condition of the protection circuit controlled by a first control signal and a second control signal, and
wherein the first control signal is an isolated p-well signal, and the isolated p-well signal is generated to bias a plurality of isolated p-wells in the apparatus, the plurality of isolated p-wells outside of the protection circuit.

9. The apparatus of claim 5, wherein the second control signal is generated by a reverse diode connection to a voltage source.

10. The apparatus of claim 5, wherein the first control signal is a negative voltage, and is provided to the protection circuit by a voltage pump.

11. The apparatus of claim 5, wherein the first control signal determines the greatest negative voltage at which the protection circuit clamps during a negative ESD event.

12. The apparatus of claim 5, wherein the first and second control signals are selectively provided to the protection circuit.

13. The apparatus of claim 1, further comprising:
an active device coupled to the dual-direction node.

14. The apparatus of claim 1, wherein the positive protection component and the negative protection component are separate and distinct.

15. The apparatus of claim 1, wherein the turn-on condition is a positive turn-on condition and the protection circuit is also configured to control a negative turn-on condition of the protection circuit.

16. The apparatus of claim 15, wherein the positive turn-on condition is a positive voltage and the negative turn-on condition is a negative voltage.

17. The apparatus of claim 1, wherein the positive and negative protection components comprise SCRs coupled to a reference voltage node.

18. The apparatus of claim 17, wherein the reference voltage node is ground.

19. The apparatus of claim 1, wherein the dual-direction node forms a part of a NAND flash memory.

20. A protection circuit, comprising:
a first silicon controlled rectifier (SCR) including a first portion formed in a first well and including a second portion formed in a second well, the first portion of the first SCR coupled to a dual-direction node; and
a second SCR including a first portion formed in the second well and including a second portion formed in the first well, the first portion of the second SCR coupled to the dual-direction node, the first and second SCRs controlled by a first control signal and a second control signal,
wherein a first turn-on condition of the first SCR is at least partially determined by the first control signal, or the lack thereof, and a second turn-on condition of the second SCR is at least partially determined by the second control signal, or the lack thereof.

21. The protection circuit of claim 20, wherein both of the first and second SCRs are configured to not snapback and are further configured to act as diodes.

22. The protection circuit of claim 20, wherein both of the first and second SCRs are controlled by both of the first and second control signals.

23. The protection circuit of claim 20, wherein the first and second SCRs are merged.

24. The protection circuit of claim 20, wherein the first and second SCRs are selectively biased such that the protection circuit turns on when a voltage applied to the dual-direction node is greater than a turn-on voltage.

25. The protection circuit of claim 20, wherein the first and second SCRs share a common n-well and a common p-well.

26. A circuit, comprising:
a first well configured to be biased with a first bias signal;
a second well, the second well configured to be biased with a second bias signal, and the first well formed within the second well;
a first doped region within the first well coupled to a reference voltage node;
a second doped region within the first well coupled to a dual-direction node;
a third doped region within the second well coupled to the reference voltage node; and
a fourth doped region within the second well coupled to the dual-direction node.

27. The circuit of claim 26, wherein the second doped region, the first well, the second well, and the third doped region form a first silicon-controlled rectifier (SCR), and the fourth doped region, the second well, the first well, and the first doped region form a second SCR, the first and second SCRs merged.

28. The circuit of claim 26, wherein the first and second wells are left floating in a first operating mode and are biased in a second operating mode.

29. The circuit of claim 28, wherein the first operating mode is a powered-off mode, and the second operating mode is a powered-on mode.

30. The circuit of claim 26, wherein the first well is an isolated p-well and the second well is an n-well.

31. The circuit of claim 26, wherein the dual-direction node is a bias pin.

* * * * *